(12) United States Patent  
Yi et al.

(10) Patent No.: US 6,670,649 B2
(45) Date of Patent: Dec. 30, 2003

(54) TRIODIC RECTIFIER SWITCH

(75) Inventors: Choong-Hoon Yi, Seoul (KR); Un-Chol Oh, Suwon (KR); Won-Pil Lee, Seoul (KR); Sun-Hee Yang, Seoul (KR); Gregory S. Um, Torrance, CA (US)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 10/012,397

(22) Filed: Dec. 12, 2001

(65) Prior Publication Data

US 2002/0080637 A1 Jun. 27, 2002

(30) Foreign Application Priority Data

Dec. 26, 2000 (KR) ........................................ 2000-82074

(51) Int. Cl.[7] .............................................. H01L 29/74
(52) U.S. Cl. .................... 257/109; 257/536; 257/613
(58) Field of Search ................... 257/109, 476, 257/536, 76, 613, 741, 750

(56) References Cited

U.S. PATENT DOCUMENTS

| | | |
|---|---|---|
| 4,983,022 A | 1/1991 | Shannon |
| 5,014,048 A | 5/1991 | Knapp |
| 5,025,250 A | 6/1991 | Hains |
| 5,069,534 A | 12/1991 | Hirai |
| 5,122,889 A | 6/1992 | Kaneko et al. |
| 5,508,591 A | 4/1996 | Kanemori et al. |
| 5,847,797 A | 12/1998 | Van Dijk |
| 5,905,484 A | 5/1999 | Verhulst |
| 5,909,264 A | 6/1999 | Fujikawa et al. |
| 5,952,991 A | 9/1999 | Akiyama |
| 6,072,457 A | 6/2000 | Hashimoto et al. |
| 6,271,050 B1 | 8/2001 | Akiba et al. |
| 6,280,273 B1 | 8/2001 | Codama |
| 6,426,542 B1 * | 7/2002 | Tan .............................. 257/483 |

* cited by examiner

*Primary Examiner*—Mark V. Prenty
(74) *Attorney, Agent, or Firm*—Robert E. Bushnell, Esq.

(57) ABSTRACT

The present invention discloses a triodic rectifier switch (TRS) having two diodes and one resistor. Each of the two diodes includes first and second electrodes, the first electrode made of a material having a work function of more than 4.5 eV (electron volts), the second electrode made of a material having a work function of less than 4.5 eV, and a semiconductor layer formed between the first and second electrode. The first electrode is made of a material selected from a group including indium tin oxide, Ni, Se, Pt, Os, Ir, Pd, Au, Cu, Ge, Be, Te, and Mo, and the second in electrode is made of a material selected from a group including K, Na, Ca, Li, Mg, In, Ta, Pb, Ag, Al, Zn, Sn, Fe, and Cr. The first and second electrodes may also have multiple layers.

22 Claims, 11 Drawing Sheets

TRIODIC RECTIFIER SWITCH

CLAIM OF PRIORITY

This application makes reference to, incorporates the same herein, and claims all benefits accruing under 35 U.S.C. §119 from an application for A TRIODIC RECTIFIER SWITCH DEVICE earlier filed in the Korean Industrial Property Office on Dec. 26, 2000 and there duly assigned Serial No. 2000-82074.

BACKGROUND OF THE INVENTION

1. Field of the invention

The present invention relates to a triodic rectifier switch and more particularly to a triodic rectifier switch for a display device.

2. Description of Related Art

A typical triodic rectifier switch (TRS) includes two junction diodes and one resistor. The TRS is one of those used as a switching element of, for example, a flat panel display device such as a liquid crystal display (LCD) device and an organic EL (electroluminescent) display.

The triodic rectifier switch is simpler in manufacturing process and lower in cost than a thin film transistor (TFT) having three terminals. Also, the triodic rectifier switch has advantages in that it can independently control a signal voltage differently from a switching element having two terminals, and it has low leakage current characteristics differently from a switching element having a combination of a diode and a capacitor.

However, such a triodic rectifier switch is at the beginning stage of research and development, and thus used materials and process to manufacture the triodic rectifier switch are not well known yet.

Exemplars of the art are U.S. Pat. No. 6,072,457 issued to Hashimoto et al., for Display and its Driving Method, U.S. Pat. No. 5,909,264 issued to Fujikawa et al., for LCD Device Having a Switching Element with Reduced Size and Capacitance and Method for Fabricating the Same, U.S. Pat. No. 5,952,991 issued to Akiyama, for Liquid Crystal Display, U.S. Pat. No. 5,905,484 issued to Verhulst, for Liquid Crystal Display Device with Control Circuit, U.S. Pat. No. 5,847,797 issued to Van Dijk, for Display Device, U.S. Pat. No. 5,508,591 issued to Kanemori et al., for Active Matrix Display Device, U.S. Pat. No. 5,122,889 issued to Kaneko et al., for Active Matrix Liquid Crystal Display Using MIM Diodes Having Symmetrical Voltage-current Characteristics as Switching Elements, U.S. Pat. No. 4,983,022 issued to Shannon, for Liquid Crystal Display Device, U.S. Pat. No. 5,069,534 issued to Hirai, for Active Matrix Liquid Crystal Display with Series-connected MIM Structures as a Switching Element, U.S. Pat. No. 6,271,050 issued to Akiba et al., for Method of Manufacturing Thin Film Diode, U.S. Pat. No. 5,025,250 issued to Hains, for Matrix Display Device, U.S. Pat. No. 5,014,048 issued to Knapp, for Matrix Display Systems, and U.S. Pat. No. 6,280,273 issued to Codama, for Organic EL Display Device and Method of Making.

For the foregoing reasons, there exists an urgent need for used materials and process to manufacture the triodic rectifier switch so that the triodic rectifier switch may have excellent characteristics as a switching element.

SUMMARY OF THE INVENTION

It is therefore an object of the preferred embodiments of the present invention to provide a triodic rectifier switch having excellent characteristics as a switching element.

It is another object to have a switching element that is easy to manufacture.

It is yet another object to have have a switching element of a display device that is inexpensive to manufacture.

In order to achieve the above and other objects, the preferred embodiments of the present invention provide a triodic rectifier switch (TRS) having two diodes and one resistor. Each of the two diodes includes first and second electrodes, the first electrode made of a material having a work function of more than 4.5 eV (electron-volt) and preferably between 4.5 eV and 6.0 eV, the second electrode made of a material having a work function of less than 4.5 eV and preferably between 2.3 eV and 4.5 eV, and a semiconductor layer formed between the first and second electrode.

The first electrode is made of a material selected from a group including ITO (indium tin oxide), Ni, Se, Pt, Os, Ir, Pd, Au, Cu, Ge, Be, Te, and Mo, and the second electrode is made of a material selected from a group including K, Na, Ca, Li, Mg, In, Ta, Pb, Ag, Al, Zn, Sn, Fe, and Cr. The semiconductor is an organic conjugated conducting polymer. The organic conjugated conducting polymer includes β-polymer (Beta-polymer) and PPV (polyphenylenevinylene). The semiconductor includes Si, Poly-Si, a-Si:H, GaAs, and SiC. The semiconductor layer has an n-type conductivity, and the doping layer is an $n^{30}$-doping layer or a p-type conductivity, and the doping layer is a $p^+$-doping layer. The resistor is made of the same material as the doping layer.

A doping layer may be formed between the semiconductor layer and the second electrode or between the semiconductor layer and the first electrode. A hole transfer layer is formed between the semiconductor layer and the first electrode, and an electron injection layer is formed between the second electrode and semiconductor layer. The diode is one of a junction diode and a schottky diode. A rectification ratio of the diode is more than $10^4$.

The first and second electrodes may also have multiple layers.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF PREFERRED EMBODIMENTS

Figure 1A:
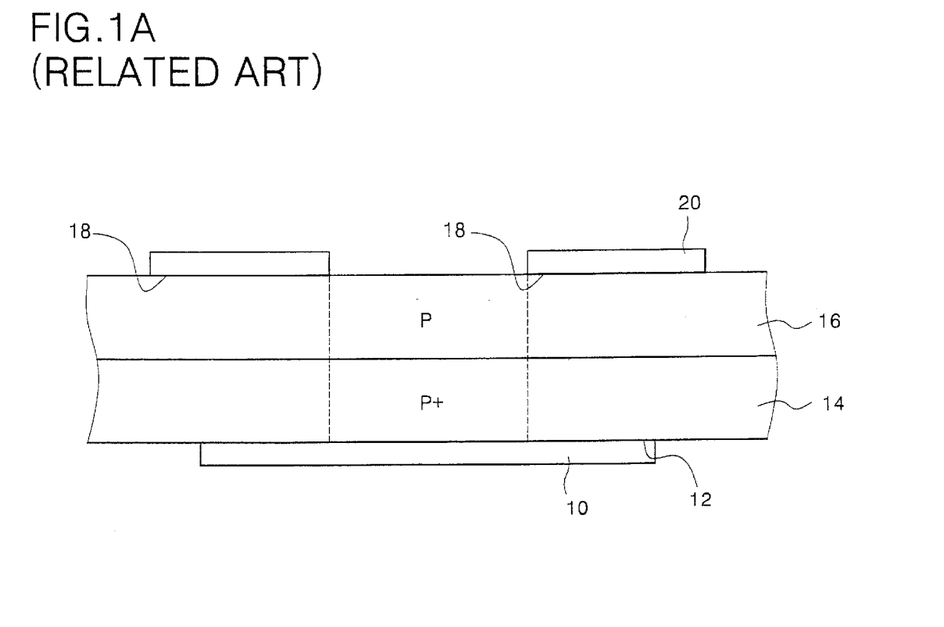
FIG. 1A shows a conventional positive triodic rectifier switch (TRS)
Figure 1B:
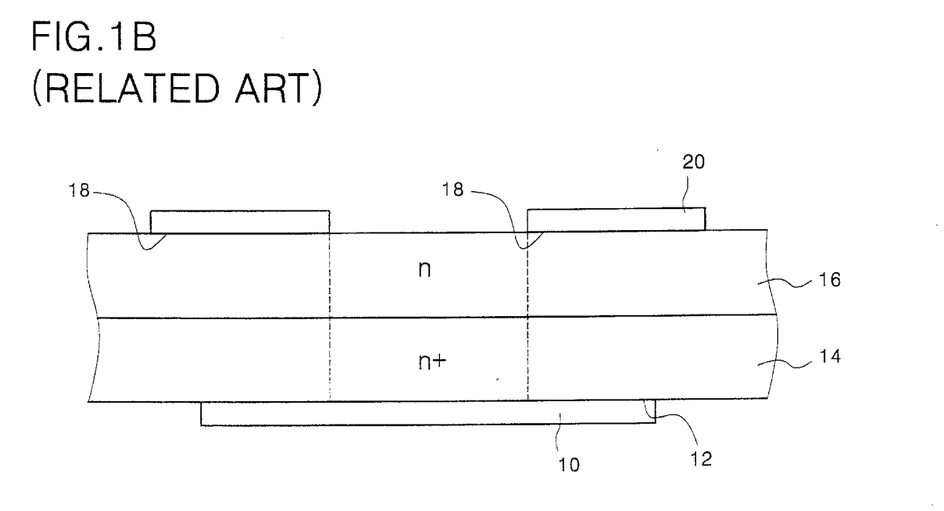
FIG. 1B shows a conventional negative triodic rectifier switch.

Turning now to the drawings, FIG. 1A shows an earlier positive triodic rectifier switch, and FIG. 1B shows an earlier negative triodic rectifier switch.

The triodic rectifier switch includes a lower electrode 10 and an upper electrode 20. A doping layer 14 is formed over the lower electrode 10. An ohmic contact layer 12 is formed between the lower electrode 10 and the doping layer 14. A semiconductor layer 16 is formed on the doping layer 14. A schottky contact layer 18 is formed between the semiconductor layer 16 and the upper electrode 20.

The semiconductor layer 16 is made of hydrogenated amorphous silicon (a-Si:H), and the upper electrode 20 is made of indium tin oxide (ITO).

At this point, if the triodic rectifier switch is of positive type as shown in FIG. 1A, the upper electrode 20 serves as a cathode, the lower electrode 10 serves as an anode, the semiconductor layer 16 has a p-type conductivity, and the doping layer 14 is a p$^+$doping layer. On the other hand, if the triodic rectifier switch is of negative type as shown in FIG. 1B, the upper electrode 20 serves as an anode, the lower electrode 10 serves as a cathode, the semiconductor layer 16 has an n-type conductivity, and the doping layer 14 is an n$^-$ doping layer.

Referring to FIGS. 2A through 4, the triodic rectifier switch includes two diodes D1 and D2 and one resistor R. The resistor R is connected to a scan line (Vscan), and the diode D1 is connected to a data line (Vdata). The diode D2 is connected to a load capacitor C, e.g., a display pixel. At this point, the type of diodes D1 and D2 is not limited in the present invention. For example, a junction diode (e.g., a p-n junction diode) or a schottky diode can be used as the diodes D1 and D2. D1 and D2 can also be structures that are equivalent to diodes. In the preferred embodiment of the present invention, the schottky diode is used as the diodes D1 and D2.

Figure 2A:
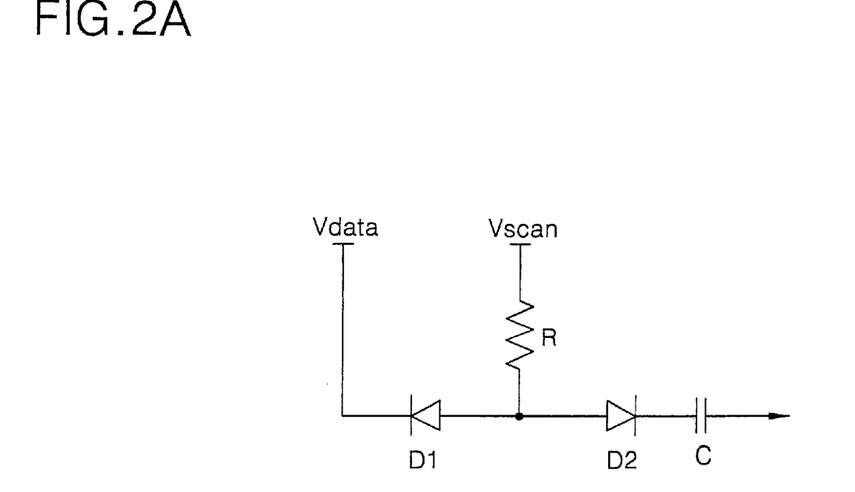
FIG. 2A is an equivalent circuit diagram illustrating a positive triodic rectifier switch according to a preferred embodiment of the present invention.
Figure 2B:
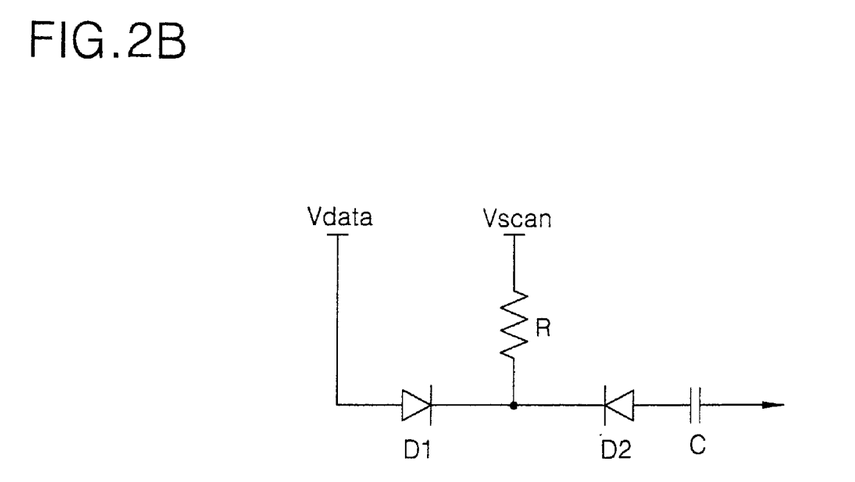
FIG. 2B is an equivalent circuit diagram illustrating a negative triodic rectifier switch according to the preferred embodiment of the present invention.

As can be seen in FIGS. 2A and 2B, an arrangement direction of the positive triodic rectifier switch and the negative triodic rectifier switch are opposite to each other.

Figure 3:
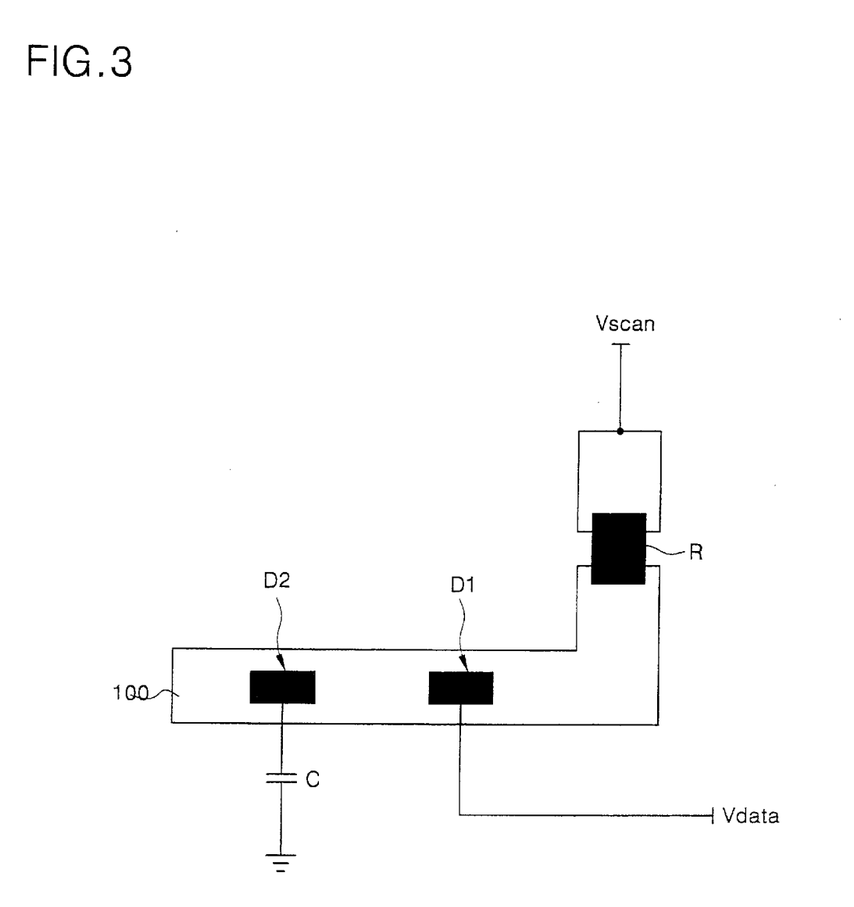
FIGS. 3 and 4 are plan views illustrating the triodic rectifier switch according to the preferred embodiment of the present invention.
Figure 4:
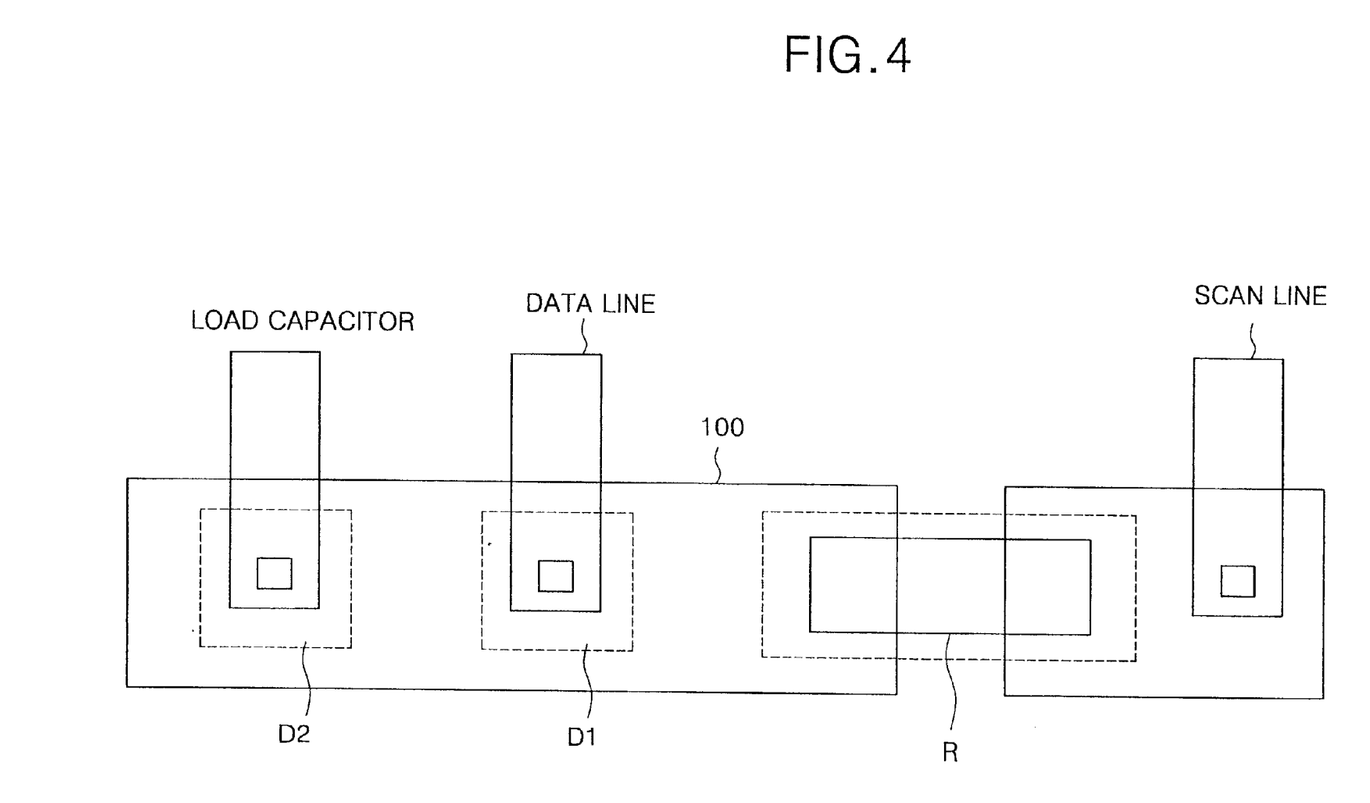
Figure 5A:
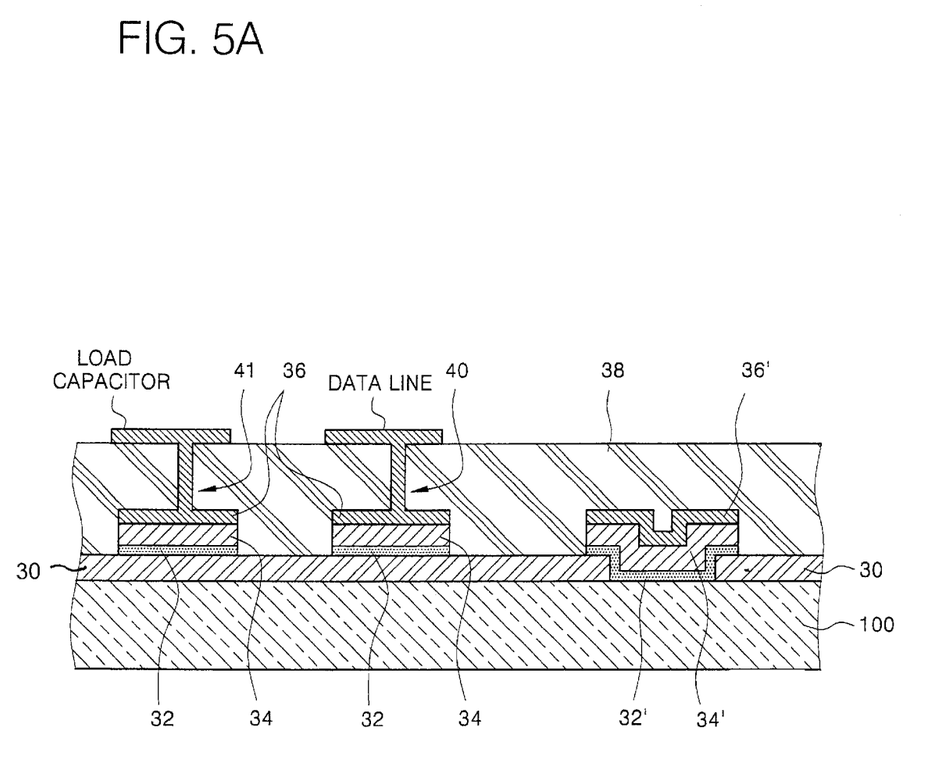
FIGS. 5A through 5C are cross-sectional views illustrating the triodic rectifier switch according to the preferred embodiment of the present invention.

In FIGS. 3 and 4, a reference numeral 100 denotes a substrate. FIG. 5A is a cross-sectional view illustrating the triodic rectifier switch according to the preferred embodiment of the present invention.

The triodic rectifier switch includes two schottky diodes D1 and D2 and one resistor R on the substrate 100. Preferably, the schottky diodes D1 and D2 have the same configuration.

As seen in FIG. 5A, each of the schottky diodes D1 and D2 includes a lower electrode 30 formed on the substrate 100, a doping layer 32, a semiconductor layer 34, and an upper electrode 36, e which are stacked in the described order. The doping layer is to provide an ohmic contact between the lower electrode 30 and the semiconductor layer 34. The lower electrodes 30 are shared with the two diodes D1 and D2 and the upper electrodes 36 are separated (each diode has a separate upper electrode 36). A schottky contact is formed between the semiconductor layer 34 and the upper electrode 36.

The resistor R includes the doping layer 32'. A semiconductor layer 34' and an upper electrode 36' on the doping layer 32' are to perform easy pattern process.

Further, a passivation layer 38 is formed on an exposed surface of the lower electrode 30 and covers the diodes D1 and D2 and the resistors R. The passivation layer 38 includes contact holes 40 and 41 at a location corresponding to a portion of the upper electrode 36.

The upper electrode 36 of the diode D1 is connected to the data line through the contact hole 40, and the upper electrode 36 of the diode D2 is connected to a load capacitor, e.g., a display pixel through the contact hole 41.

If the triodic rectifier switch of FIG. 5A is of positive type, the semiconductor layer 34 of the diodes D1 and D2 has a p-type conductivity, and the doping layer is a p$^+$-doping layer. If the triodic rectifier switch of FIG. 5A is of negative type, the semiconductor layer 34 of the diodes D1 and D2 has an n-type conductivity, and the doping layer 32 is an n$^+$-doping layer.

If the triodic rectifier switch (TRS) is of positive type, the upper electrode serves as the cathode, and the lower electrode serves as the anode. And if the triodic rectifier switch is of negative type, the upper electrode serves as the anode, and the lower electrode serves as the cathode.

The semiconductor layer 34 includes either of an organic material and an inorganic material. A material that is high in rectification ratio or on-current/off-current ratio in I–V characteristics can have a good schottky contact and a high speed switching operation. The rectification ratio or on-current/off-current ratio is preferably more than $10^4$.

The organic semiconductor includes an organic conjugated conducting polymer such as β-polymer and PPV. The inorganic semiconductor includes Si, poly-Si, a-Si:H, GaAs, and SiC.

Figure 5B:
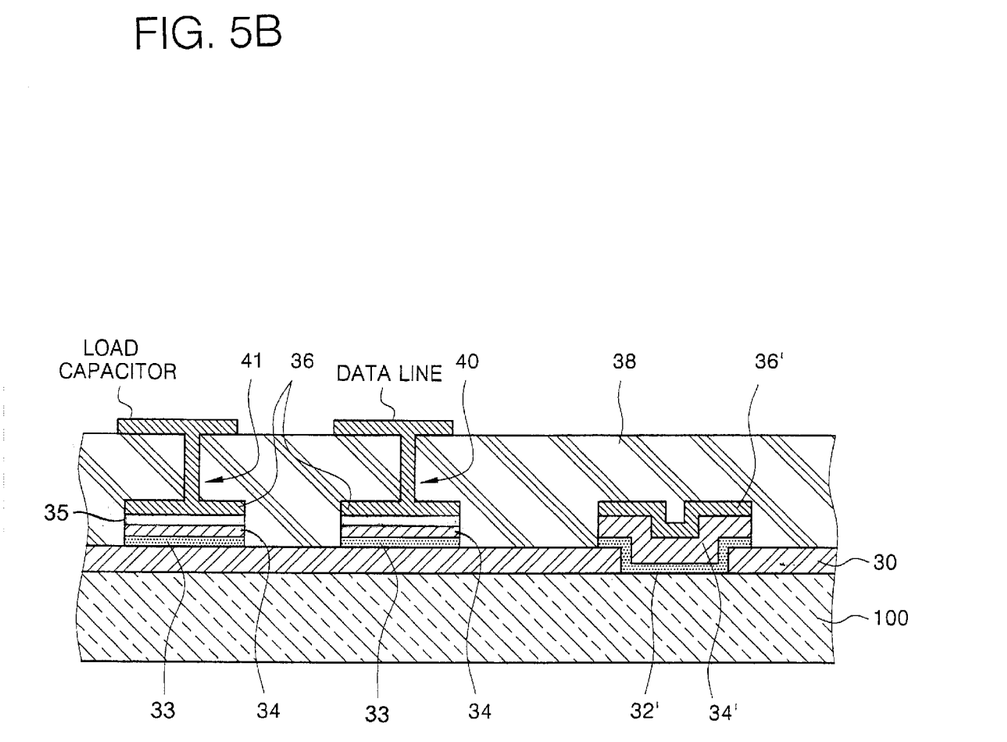

If the semiconductor layer includes the organic semiconductor, a hole transfer layer can be formed between the anode electrode and the semiconductor layer instead of the doping layer, and an electron injection layer can be formed between the cathode electrode and the semiconductor layer. The electron injection layer includes one of LiF and Ca. The positive triodic rectifier switch having such a structure is shown in FIG. 5B. In FIG. 5B, a reference numeral 33 denotes the hole transfer layer, a reference numeral 34 denotes the semiconductor layer, and a reference numeral 35 denotes the electron injection layer.

The positive triodic rectifier switch has a hole as a major carrier, and the negative triodic rectifier switch has an electron as a major carrier. Therefore, the cathode includes a material having a relatively low work function, and the anode includes a material having a relatively high work function.

Preferably, a material having the relatively high work function is one which is more than 4.5 eV and more preferably in a range between 4.5 eV and 6.0 eV, and a material having the relatively low work function is one which is less than 4.5 eV and more preferably in a range between 2.3 eV and 4.5 eV.

For example, assume that the triodic rectifier switch is of negative type. Since the major carrier is an electron, the lower electrode 30 includes a material having a relatively low work function (i.e., less than 4.5 eV) so that the ohmic contact between the lower electrode 30 and the semiconductor layer 34 may be enhanced. Also, the upper electrode 36 includes a material having a relatively high work function (i.e., more than 4.5 eV) so that the schottky contact between the semiconductor layer 34 and the upper electrode 36 may be enhanced.

A material that a work function is less than 4.5 eV includes K(2.3 eV), Na(2.75 eV), Ca(2.87 eV), Li(2.9 eV), Mg(3.66 eV), In(4.12 eV), Ta(4.25 eV), Pb(4.25 eV), Ag(4.26 eV), Al(4.28 eV), Zn(4.38 eV), Sn(4.42 eV), Fe(4.50 eV), and Cr(4.50 eV).

A material that a work function is more than 4.5 eV includes ITO(4.9 eV), Ni(5.0~5.4 eV), Se(5.9 eV), Pt(5.2~5.9 eV), Os(5.93 eV), Ir(5.0~5.7 eV), Pd(5.2~5.6 eV), Au(5.3~5.5 eV), Cu(4.5~5.1 eV), Ge(5.0 eV), Be(5.0 eV), Te(5.0 eV), and Mo(4.55 ~5 eV).

The triodic rectifier switch can also have the electrodes made of multiple layers. In this case, the nearest layer of the anode electrode to the semiconductor layer is made of a material having a relatively high work function, and the other layers are made of a conductive material suitable for an anode electrode layer. Also, the nearest layer of the cathode electrode to the semiconductor layer is made of a material having a relatively low work function, and the other layers are made of a conductive material suitable for a cathode electrode layer.

Figure 5C:
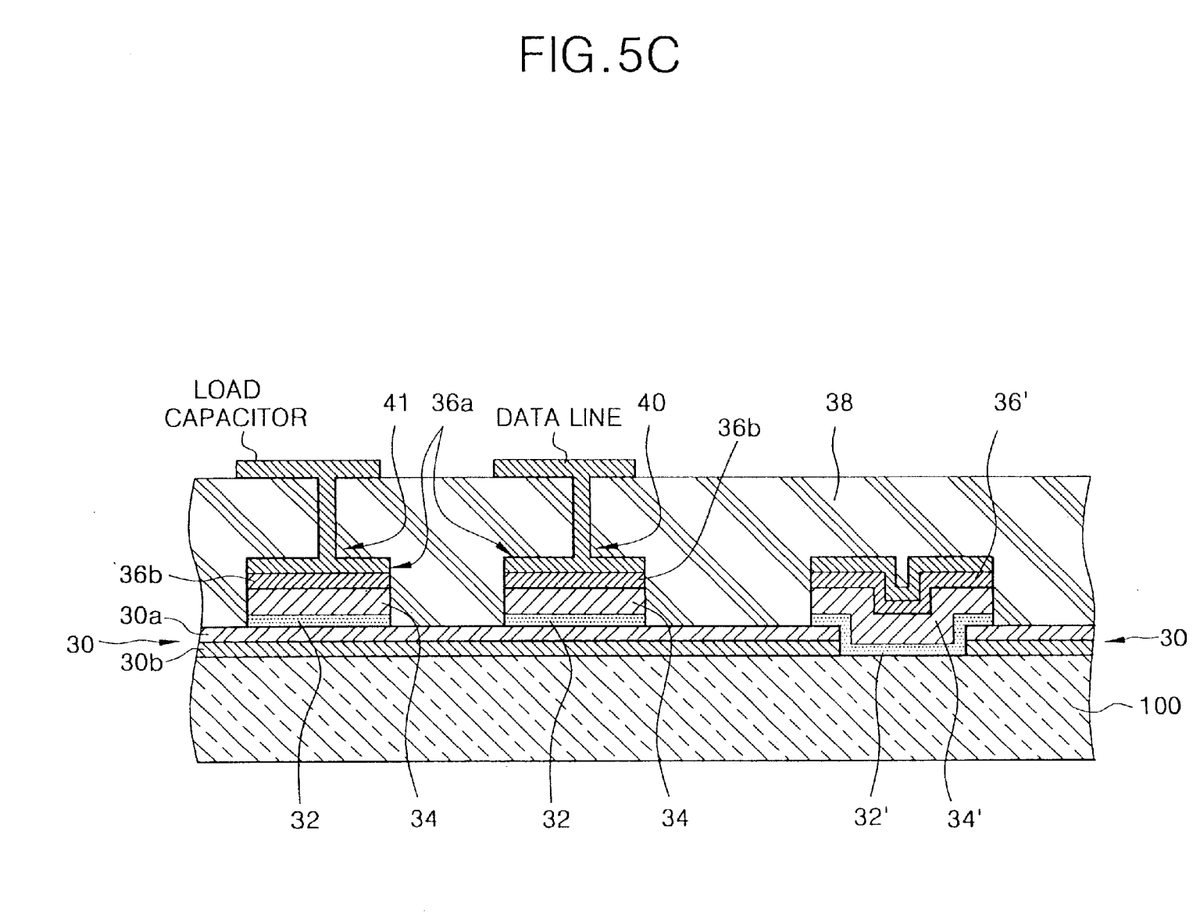

Referring to FIG. 5C, the upper electrode 36 and the lower electrodes 30 have a dual-layered W structure, respectively. The upper electrode 36 can be made of a first layer 36a and a second layer 36b. The second layer 36b of the upper electrode 36 can include a material selected from indium tin oxide, Ni, Se, Pt, Os, Ir, Pd, Au, Cu, Ge, Be, Te, Mo, and a combination thereof. The first layer 36a of the upper electrode 36 can include any material having good conductivity. The lower electrode 30 can also include a first layer 30a and a second layer 30b. The first layer 30a of the lower electrode 30 can each include a material selected from K, Na, Ca, Li, Mg, In, Ta, Pb, Ag, Al, is Zn, Sn, Fe, Cr, and a combination thereof. The second layer 30b of the lower electrode 36 can include any material having good conductivity. For example, the first layer 36a can include a material selected from indium tin oxide, Ni, Se, Pt, Os, Ir, Pd, Au, Cu, Ge, Be, Te, Mo, K, Na, Ca, Li, Mg, In, Ta, Pb, Ag, Al, Zn, Sn, Fe, Cr, and a combination thereof, and the second layer 36b can include a material selected from indium tin oxide, Ni, Se, Pt, Os, Ir, Pd, Au, Cu, Ge, Be, Te, Mo, and a combination thereof.

EXAMPLE 1

Positive TRS (Triodic Rectifier Switch) Having the Organic Semiconductor Layer

Each of the diodes D1 and D2 includes an upper electrode (i.e., cathode), an electron injection layer, an organic semiconductor layer, a hole transfer layer, and a lower electrode (i.e., anode). The upper electrode is made of Al and has a thickness of 1000 Å to 2000 Å (Angstrom). The electron injection layer is made of LiF and has a thickness of 10 Å to 100 Å. The organic semiconductor layer is made of β-polymer and has a thickness of 1000 Å to 2000 Å. The hole transfer layer is made of PEDOT (poly(ethylene dioxythiopene)) and has a thickness of 500 Å to 1000 Å. The lower electrode is made of indium tin oxide (ITO) and has a thickness of 1000 Å to 2000 Å. The resistor R is made of PEDOT.

Figure 6:
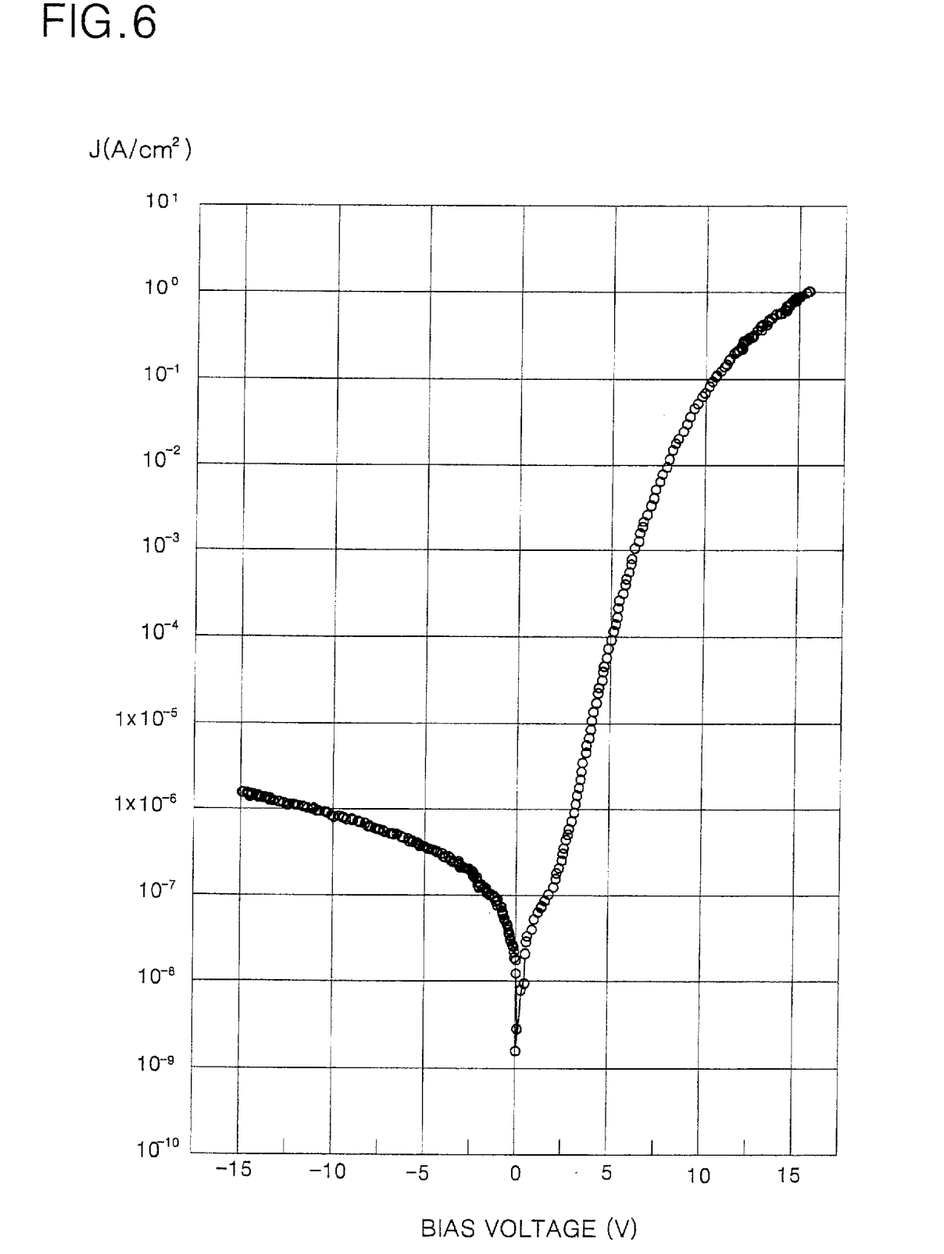
FIG. 6 is a graph illustrating I–V characteristics of a first exemplary triodic rectifier switch.

A glass substrate on which ITO is coated is used as the substrate 100. PEDOT and β-polymer are deposited using a spin coating technique. LiF and Al are deposited by an evaporator. All components are patterned by a dry-etching technique. The TRS (triodic rectifier switch) has a size of 2 mm×2 mm (millimeters). The TRS manufactured by the above-described manner shows I–V characteristics of FIG. 6.

Figure 7:
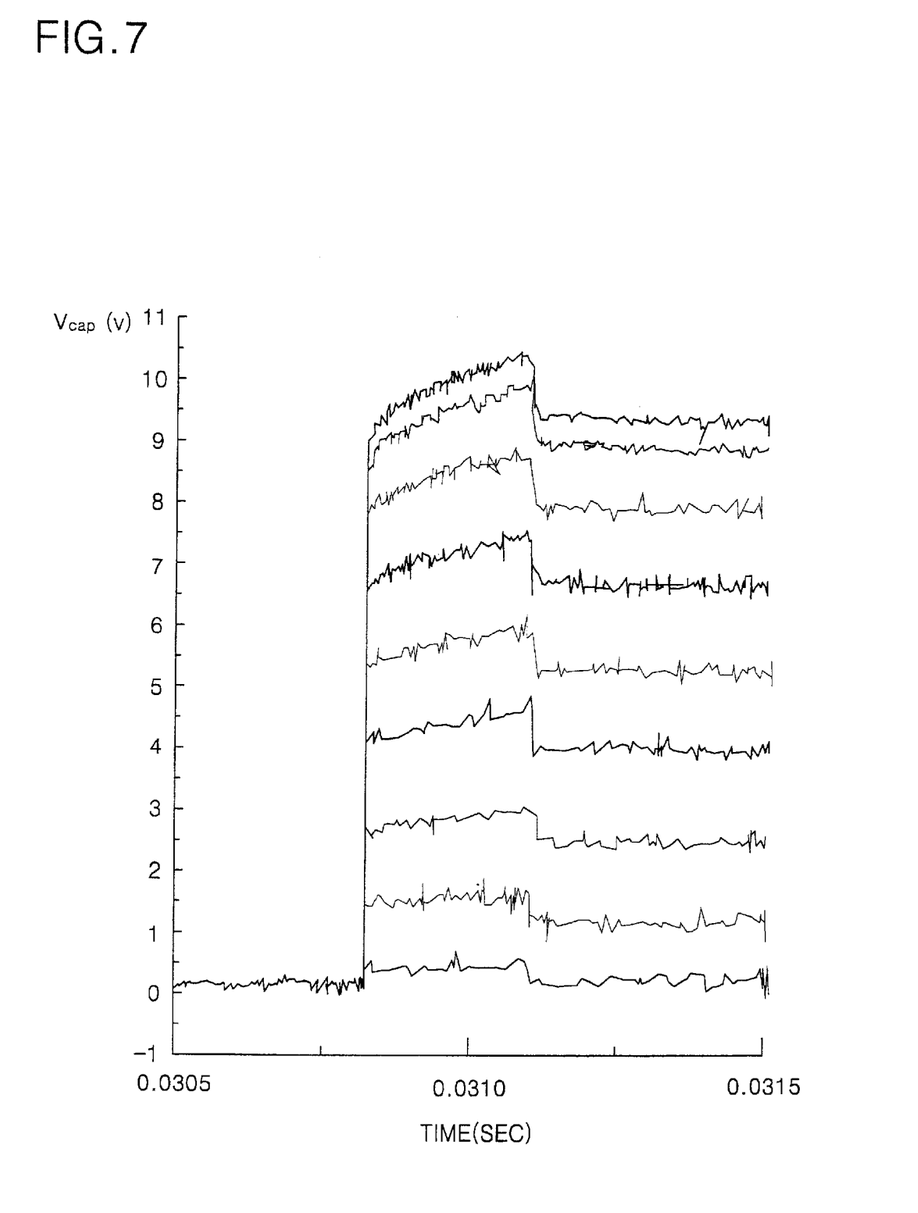
FIG. 7 is a graph illustrating voltages Vcap of the load capacitor measured when different voltages Vdata are applied to the data line of the first exemplary triodic rectifier switch according to the preferred embodiment of the present invention.

FIG. 7 is a graph illustrating voltages Vcap of the load capacitor measured when different voltages Vdata are applied to the data line. A voltage Vscan of 15 V is applied to the scan line, the load capacitor has a capacitance of 10 nF (nano-farad), and the voltages Vdata of from −6 V to 12 V (volts) are applied to the data line. A voltage Vcap of the load capacitor is dynamically measured when the triodic rectifier switch is turned on or off. A measuring time is 250 μsec (microseconds).

As can be seen in FIG. 7, the switch was off at that moment when a kickback phenomenon occurrs. Thereafter, various gray scales can be embodied because various capacitor voltages Vcap are shown when different voltages Vdata are applied. Curves of FIG. 7 represent measured values of charging time of a load capacitor at different voltages Vdata. Therefore, the TRS of Example 1 satisfies a requirement of a switching element of flat panel displays.

EXAMPLE 2

Negative TRS (Triodic Rectifier Switch) Having an Inorganic Semiconductor Layer

Each of the diodes D1 and D2 includes an upper electrode, a semiconductor layer, a doping layer, and a lower electrode. The upper electrode (i.e., anode) is made of ITO (indium tin oxide) and has a thickness of 2000 Å. The semiconductor layer is made of $n^+$ doped a-Si:H and has a thickness of 7000 Å. The doping layer is made of $n^+$a-Si:H and has a thickness of 700 Å. The lower electrode (i.e., cathode) is made of Cr and has a thickness of 1500 Å.

A schottky contact is formed between the upper electrode and the semiconductor, and an ohmic contact is formed between the semiconductor layer and the lower electrode.

Cr is deposited using a sputtering technique and patterned to form the lower electrode. Thereafter, $N^+$ doped a-Si:H and a-Si:H are deposited using the PECVD (plasma-enhanced chemical vapor deposition) technique, and ITO (indium tin oxide) is deposited using a sputtering technique. $N^+$ doped a-Si:H, a-Si:H and ITO are simultaneously patterned to form the doping layer, the semiconductor layer and the upper electrode. Subsequently, SiNx (silicon nitride) deposited in a thickness of 5000 Å to 6000 Å and patterned to form a passivation layer having contact holes. Finally, ITO is deposited using a sputtering technique and patterned.

A deposition condition of the PECVD process for n+doped a-Si:H is as follows: an input power of 100 W to 600 W; an electrode distance of 600 mil to 1300 mil; a working pressure of 500 mtorr to 1500 mtorr; $PH_3/SiH_4$= 0.5~5%; and a substrate temperature of 250° C. to 400° C. (Celsius).

A deposition condition of the PECVD process for a-Si:H is as follows: an input power of 100 W to 200 W (watts); an electrode distance of 600 mil to 1000 mil; a working pressure of 1000 mtorr to 2000 mtorr (millitorr); $SiH_4/H_2$= 0.1~0.3%; and a substrate temperature of 250° C. to 400° C.

A deposition condition of the PECVD process for SiNx is as follows: RF (radio frequency) power of 1 KW to 3.5 KW (kilowatts); flow rate of 100 sccm to 500 sccm (standard cubic be centimeters per minute); N2 and SiH$_4$; a working pressure of 2 torr to 5'10$^{-3}$-torr; and a substrate temperature of 200° C. to 400° C.

The TRS manufactured by the above-described manner is used as a switching element of an LCD (liquid crystal display) having a resolution of 60 Hz (hertz) SXGA (super extended graphics array of resolution 1280×1024).

The LCD has the follow specification: LCD pixel pitch= 350 rtm; LC pixel capacitance=2.9 pF (picoFarads); TRS diode area=20×20 $\mu$m$^2$ (micrometers squared); LC capacitor voltage range=0~5 V; LC maximum charge Q$_{LC}$=29.5 pF×5 V=15 pC (pico-coulombs); and CL charge Q$_{LC}$ in off state= 5% of QLC=0.075 pC.

A switching element for the LCD has an on-time Ton=1/ (60×1024)=16 $\mu$s (microseconds) and a frame time Tframe= 1/60=16.7 ms (milliseconds). Also, a voltage range for driving the LCD (liquid crystal display) is 2 V.

Therefore, the TRS has to satisfy the following: on-current Ion>QLC/Ton=0.09 $\mu$A; and off-current Ioff<Q$_{LC}$/Toff=0.075 pC/16.7 ms=4.5 pA (pico-amperes).

Figure 8:
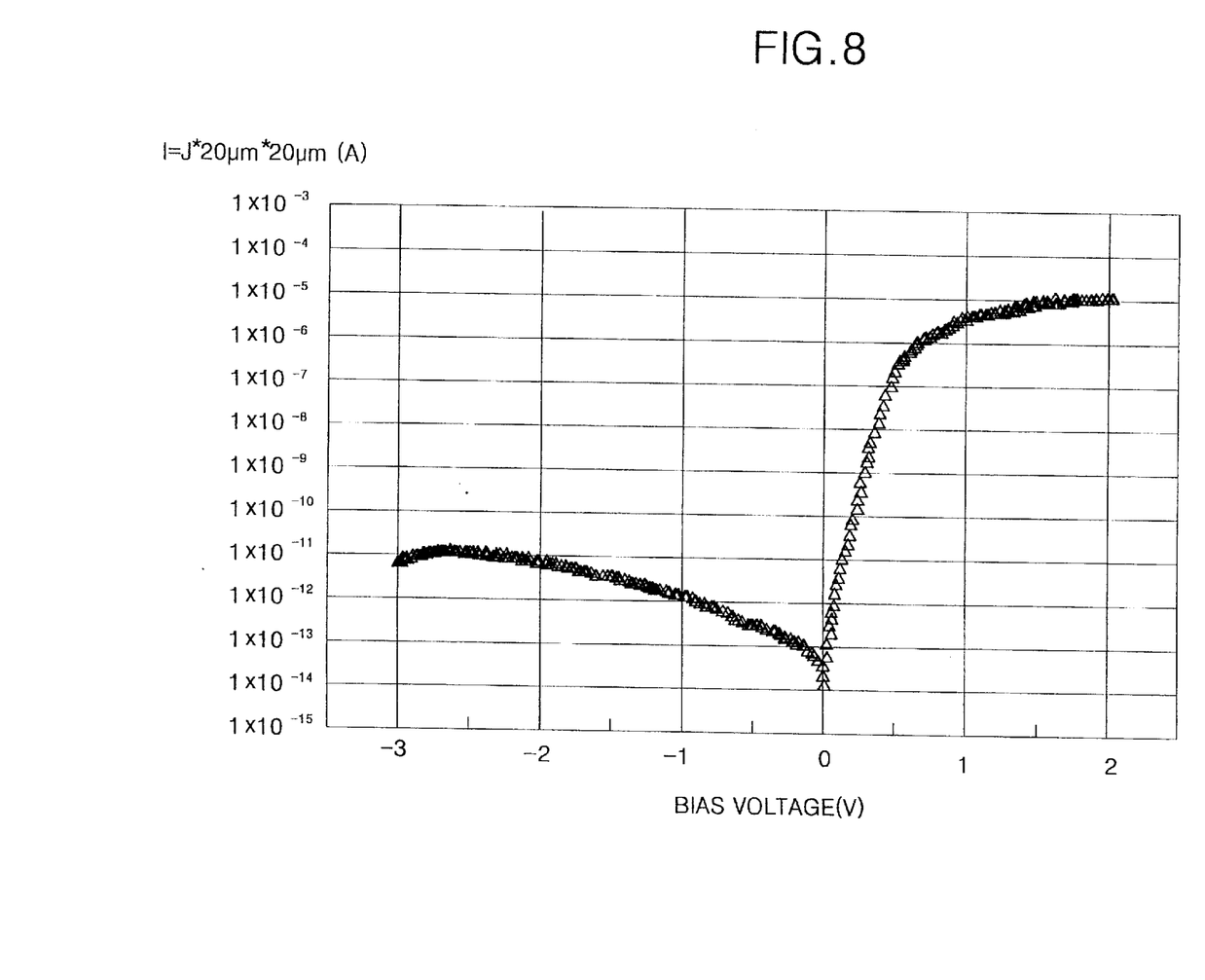
FIG. 8 is a graph illustrating I–V characteristics of a second exemplary triodic rectifier CF switch according to the preferred embodiment of the present invention.

When used as a switching element of an LCD (liquid crystal display) having a resolution of 60 Hz SXGA (1280× 1024), The TRS shows I–V characteristics of FIG. 8. As can be seen in FIG. 8, the TRS sufficiently satisfies the on-current Ton and the off-current Toff within the driving voltage range of 2 V.

Therefore, the TRS of Example 2 satisfies a requirement of a switching element of flat panel displays.

Figure 9:
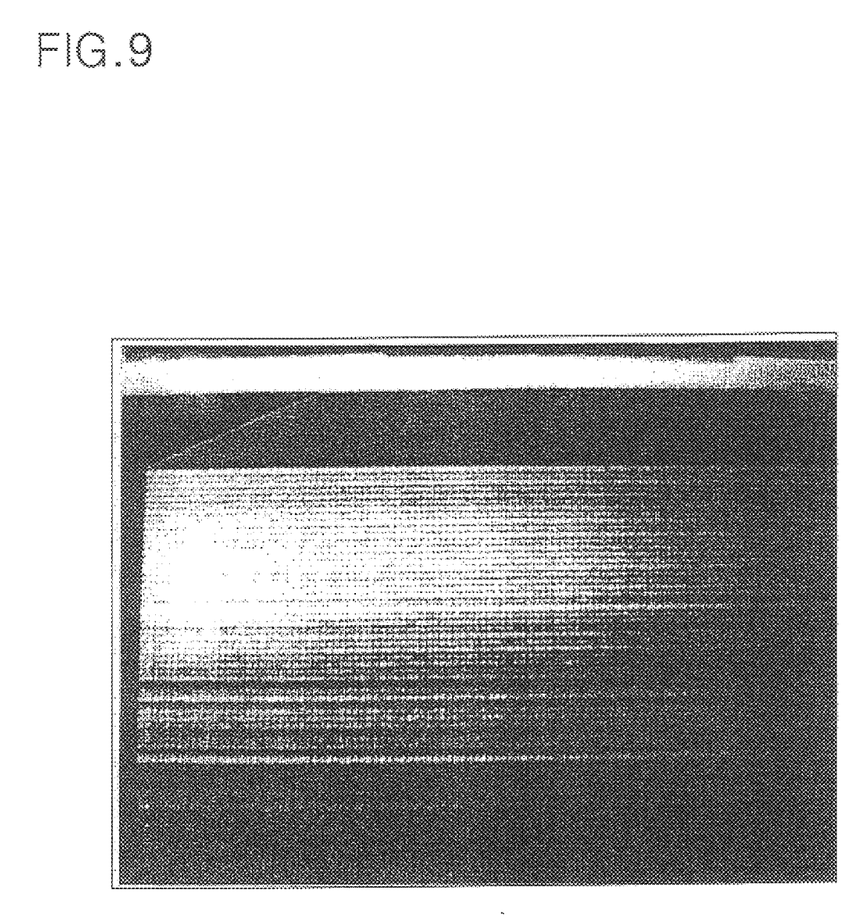
FIG. 9 is a photograph illustrating an image shown when the second exemplary triodic rectifier switch is used as a switching element of the liquid crystal display (LCD).

FIG. 9 is a photograph illustrating an image shown when the TRS is used as a switching it element of the LCD.

As described herein before, using the materials and the process according to the preferred embodiment of the present invention, the triodic rectifier switch (TRS) having excellent characteristics can be obtained.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A triodic rectifier switch, comprising:
 a resistor; and
 two diodes connected with said resistor, each of said two diodes, comprising:
  first and second electrodes, said first electrode including a material having a work function of more than 4.5 eV, said second electrode made of a material having a work function of less than 4.5 eV; and
  a semiconductor layer formed between said first and second electrodes.

2. The triodic rectifier switch of claim 1, further comprised of said first electrode being made of a material having a work function between 4.5 eV and 6.0 eV, and said second electrode being made of a material having a work function between 2.3 eV and 4.5 eV.

3. The triodic rectifier switch of claim 2, further comprised of said first electrode being made of a material selected from a group consisting essentially of indium tin oxide, Ni, Se, Pt, Os, Ir, Pd, Au, Cu, Ge, Be, Te, and Mo, and said second electrode being made of a material selected from a group consisting essentially of K, Na, Ca, Li, Mg, In, Ta, Pb, Ag, Al, Zn, Sn, Fe, and Cr.

4. The triodic rectifier switch of claim 1, said semiconductor layer being an organic conjugated conducting polymer.

5. The triodic rectifier switch of claim 4, said organic conjugated conducting polymer including $\beta$-polymer and polyphenylene vinylene (PPV).

6. The triodic rectifier switch of claim 1, further comprised of said semiconductor layer including Si, Poly-Si, a-Si:H, GaAs, and SiC.

7. The triodic rectifier switch of claim 1, further comprising a doping layer on said semiconductor layer.

8. The triodic rectifier switch of claim 7, further comprised of said semiconductor layer having an n-type conductivity, and said doping layer being an n$^-$-doping layer.

9. The triodic rectifier switch of claim 7, further comprised of said semiconductor layer being a p-type conductivity, and said doping layer being a p$^+$-doping layer.

10. The triodic rectifier switch of claim 7, with said resistor comprising of the same material as said doping layer.

11. The triodic rectifier switch of claim 8, further comprised of said doping layer being formed between said semiconductor layer and said second electrode.

12. The triodic rectifier switch of claim 9, further comprised of said doping layer formed between said semiconductor layer and said first electrode.

13. The triodic rectifier switch of claim 4, further comprising:
 a hole transfer layer formed between said semiconductor layer and said second electrode; and
 an electron injection layer formed between said first electrode and said semiconductor layer.

14. The triodic rectifier switch of claim 1, further comprised of said two diodes selected from the group consisting essentially of a junction diode and a schottky diode.

15. The triodic rectifier switch of claim 1, further comprised of a rectification ratio of one of said two diodes being more than 10$^4$.

16. A triodic rectifier switch, comprising:
 a resistor, and
 two diodes connected with said resistor, each of said two diodes, comprising:
  first and second electrodes including multiple layers; and
  a semiconductor layer formed between said first and second electrodes,
  wherein the nearest layer of the first electrode to the semiconductor layer made of a material having a work function of more than 4.5 eV, the nearest layer of the second electrode to the semiconductor layer made of a material having a work function of less than 4.5 eV.

17. The triodic rectifier switch of claim 16, with the nearest layer of the first electrode to the semiconductor layer further comprising of the materials from a group consisting essentially of indium tin oxide, Ni, Se, Pt, Os, Ir, Pd, Au, Cu, Ge, Be, Te, Mo, and a combination of any of indium tin oxide, Ni, Se, Pt, Os, Ir, Pd, Au, Cu, Ge, Be, Te, and Mo, and the nearest layer of the second electrode to the semiconductor layer, comprising of the materials from a group consisting essentially of K, Na, Ca, Li, Mg, In, Ta, Pb, Ag, Al, Zn, Sn, Fe, Cr, and a combination of any of K, Na, Ca, Li, Mg, In, Ta, Pb, Ag, Al, Zn, Sn, Fe and Cr.

18. A rectifier switch of a display device, comprising
 a first unit conducting current in only one direction, said first unit, comprising:
  first and second electrodes, said first electrode including a material having a work function of more than 4.5 eV, said second electrode made of a material having a work function of less than 4.5 eV;

a semiconductor layer formed between said first and second electrodes;

a hole transfer layer formed between said semiconductor layer and said second electrode; and an electron injection layer formed between said first electrode and said semiconductor layer, said semiconductor layer being an organic conjugated conducting polymer, said organic conjugated conducting polymer including β-polymer and polyphenylene vinylene (PPV).

19. The rectifier switch of claim 18, further comprised of said first electrode being made of a material having a work function between 4.5 eV and 6.0 eV, and said second electrode being made of a material having a work function between 2.3 eV and 4.5 eV.

20. The rectifier switch of claim 19, further comprised of said first electrode being made of a material selected from a group consisting essentially of indium tin oxide, Ni, Se, Pt, Os, Ir, Pd, Au, Cu, Ge, Be, Te, and Mo, and said second electrode being made of a material selected from a group consisting essentially of K, Na, Ca, Li, Mg, In, Ta, Pb, Ag, Al, Zn, Sn, Fe, and Cr.

21. The rectifier switch of claim 18, further comprised of said first unit being a diode selected from the group consisting essentially of a junction diode and a schottky diode.

22. The rectifier switch of claim 18, with said first electrode consisting essentially of a material having a work function of more than 4.5 eV, and said second electrode consisting essentially of a material having a work function of less than 4.5 eV.

* * * * *